(12) United States Patent
Hou et al.

(10) Patent No.: US 10,868,195 B2
(45) Date of Patent: *Dec. 15, 2020

(54) IMPACT IONIZATION SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tuo-Hung Hou, Hsinchu (TW); Samuel C. Pan, Hsinchu (TW); Pang-Shiuan Liu, Taoyuan (TW)

(73) Assignees: TAIWAN SEMICONDUCTOR MANUFACTURING CO., LTD., Hsinchu (TW); NATIONAL CHIAO TUNG UNIVERSITY, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/687,751

(22) Filed: Nov. 19, 2019

(65) Prior Publication Data

US 2020/0105943 A1 Apr. 2, 2020

Related U.S. Application Data

(63) Continuation of application No. 15/649,331, filed on Jul. 13, 2017, now Pat. No. 10,510,903.

(Continued)

(51) Int. Cl.
*H01L 29/792* (2006.01)
*H01L 29/423* (2006.01)
(Continued)

(52) U.S. Cl.
CPC .......... *H01L 29/792* (2013.01); *H01L 29/045* (2013.01); *H01L 29/40117* (2019.08);
(Continued)

(58) Field of Classification Search
CPC . H01L 29/783; H01L 29/7839; H01L 29/045; H01L 29/41725; H01L 29/66833
(Continued)

(56) References Cited

U.S. PATENT DOCUMENTS 8,119,488 B2 2/2012 Hellings et al.
8,987,077 B2 3/2015 Oka
(Continued)

OTHER PUBLICATIONS

B. Radisavljevic et al., "Single-layer MoS2 transistors", Nature Nanotechnology, Mar. 2011, vol. 6, pp. 147-150.
(Continued)

*Primary Examiner* — Tan N Tran
(74) *Attorney, Agent, or Firm* — McDermott Will & Emery LLP

(57) ABSTRACT

A semiconductor device including a field effect transistor (FET) device includes a substrate and a channel structure formed of a two-dimensional (2D) material over the substrate. Source and drain contacts are formed partially over the 2D material. A first dielectric layer is formed at least partially over the channel structure and at least partially over the source and drain contacts. The first dielectric layer is configured to trap charge carriers. A second dielectric layer is formed over the first dielectric layer, and a gate electrode is formed over the second dielectric layer.

20 Claims, 6 Drawing Sheets

Related U.S. Application Data

(60) Provisional application No. 62/427,706, filed on Nov. 29, 2016.

(51) Int. Cl.
*H01L 29/786* (2006.01)
*H01L 21/28* (2006.01)
*H01L 29/47* (2006.01)
*H01L 29/78* (2006.01)
*H01L 29/04* (2006.01)
*H01L 29/417* (2006.01)
*H01L 29/66* (2006.01)

(52) U.S. Cl.
CPC .... *H01L 29/41725* (2013.01); *H01L 29/4234* (2013.01); *H01L 29/47* (2013.01); *H01L 29/66833* (2013.01); *H01L 29/785* (2013.01); *H01L 29/7839* (2013.01); *H01L 29/78681* (2013.01); *H01L 29/78684* (2013.01); *H01L 29/78696* (2013.01)

(58) Field of Classification Search
USPC ........................................................ 257/324
See application file for complete search history.

(56) References Cited

U.S. PATENT DOCUMENTS

| | | | |
|---|---|---|---|
| 9,553,155 B2 | 1/2017 | Strassburg et al. | |
| 9,685,546 B2 | 6/2017 | Shimizu et al. | |
| 9,812,540 B2 | 11/2017 | Cheng | |
| 10,510,903 B2* | 12/2019 | Hou .................. | H01L 29/785 |
| 2013/0062669 A1 | 3/2013 | Chen et al. | |
| 2013/0105824 A1 | 5/2013 | Paranjape et al. | |
| 2014/0131698 A1 | 5/2014 | Kim et al. | |
| 2014/0183453 A1 | 7/2014 | Kim et al. | |
| 2014/0197459 A1 | 7/2014 | Kis et al. | |
| 2014/0273259 A1 | 9/2014 | Friedman et al. | |
| 2016/0372553 A1 | 12/2016 | Xiao | |
| 2017/0005197 A1 | 1/2017 | Xiao | |
| 2017/0256667 A1 | 9/2017 | Lee et al. | |
| 2018/0108786 A1 | 4/2018 | Xu | |

OTHER PUBLICATIONS

Non-final Office Action issued in related U.S. Appl. No. 15/649,331, dated Jun. 15, 2018.

Final Office Action issued in related U.S. Appl. No. 15/649,331, dated Apr. 1, 2019.

Notice of Allowance issued in related U.S. Appl. No. 15/649,331, dated Aug. 13, 2019.

* cited by examiner

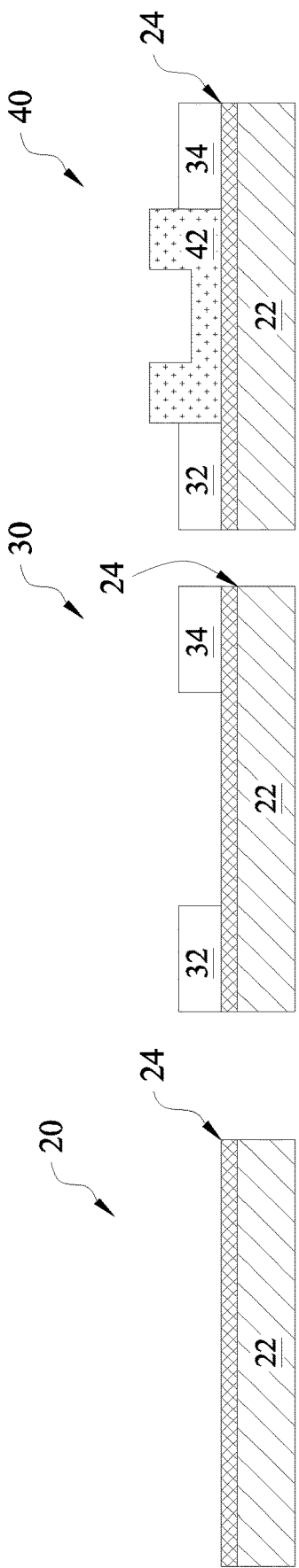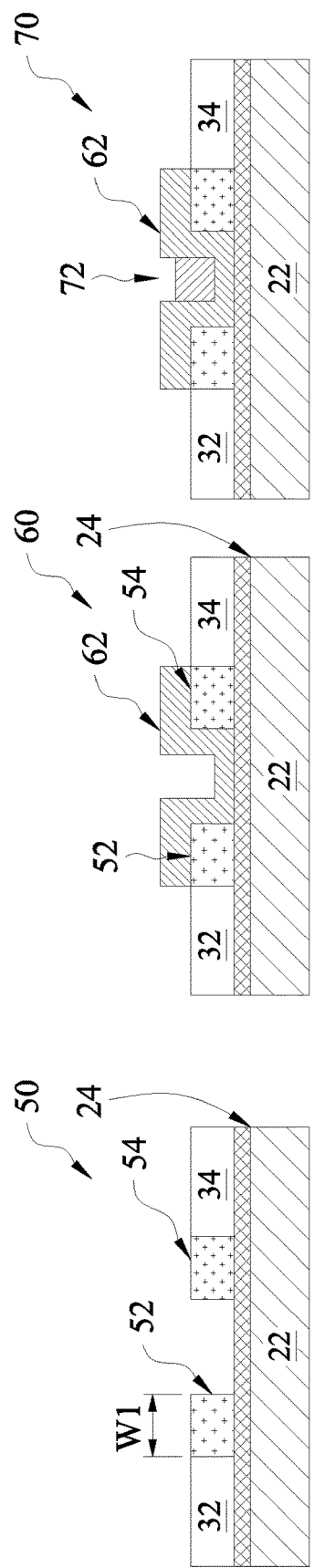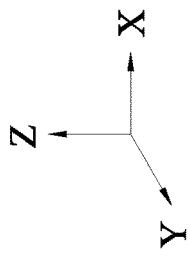

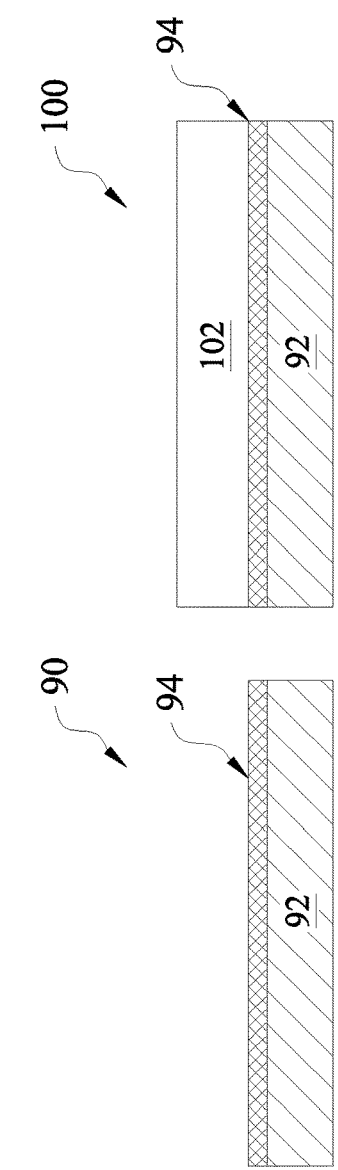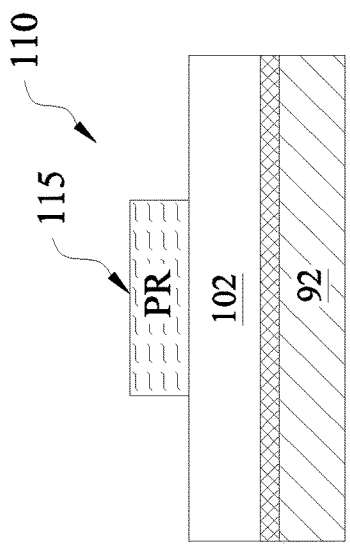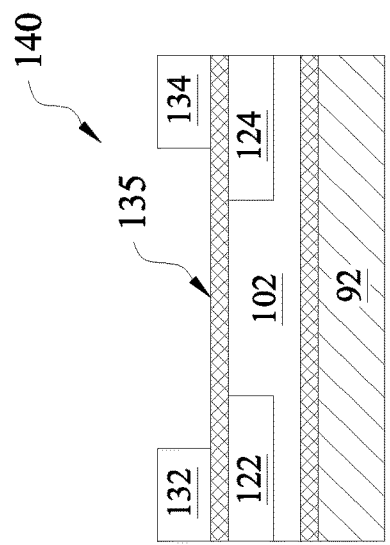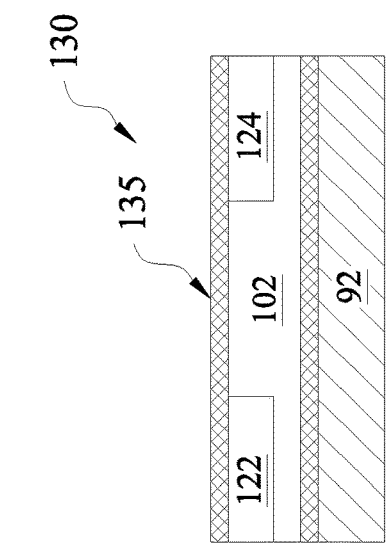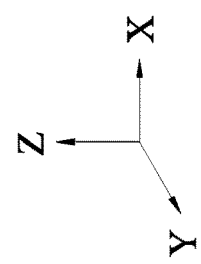
FIG. 9
FIG. 10
FIG. 11
FIG. 12
FIG. 13
FIG. 14

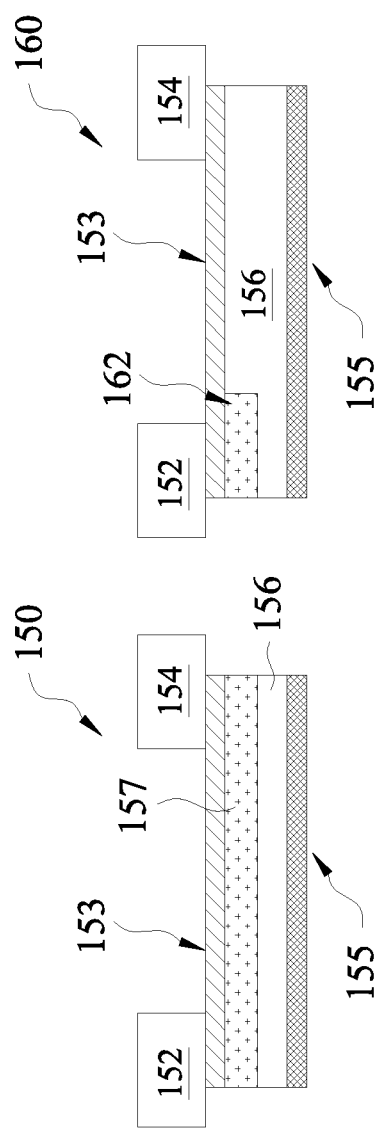
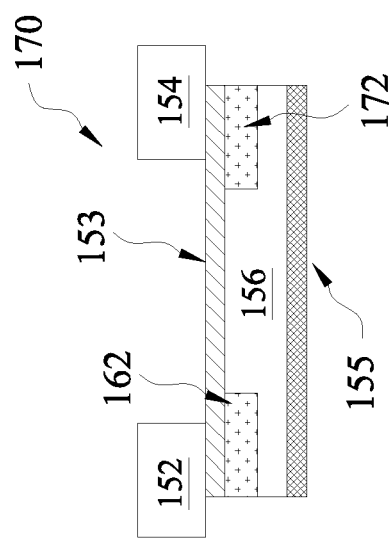
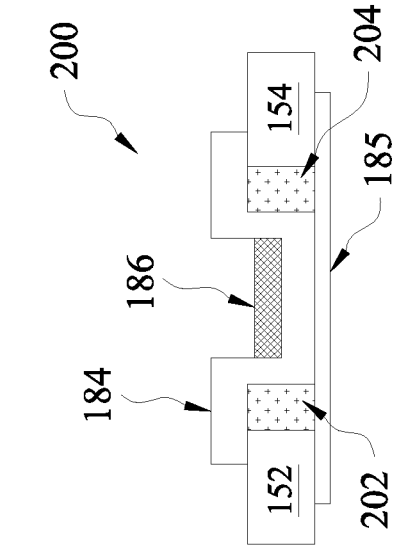
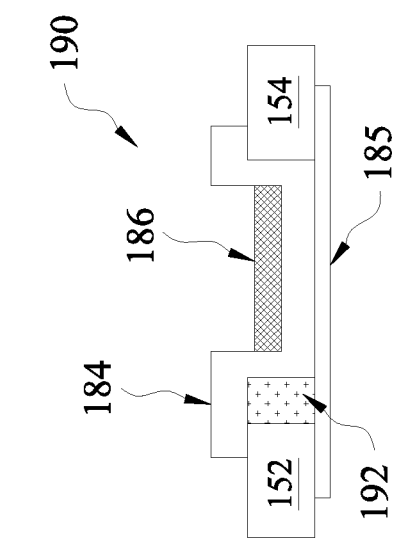
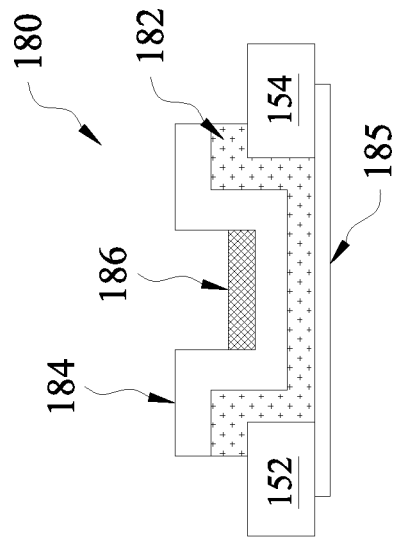
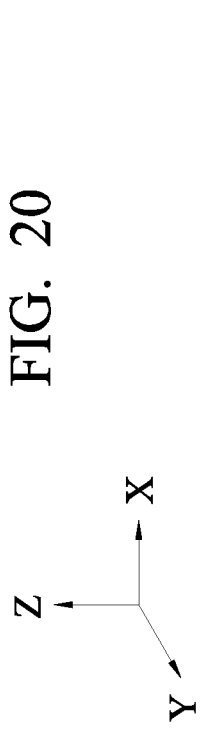

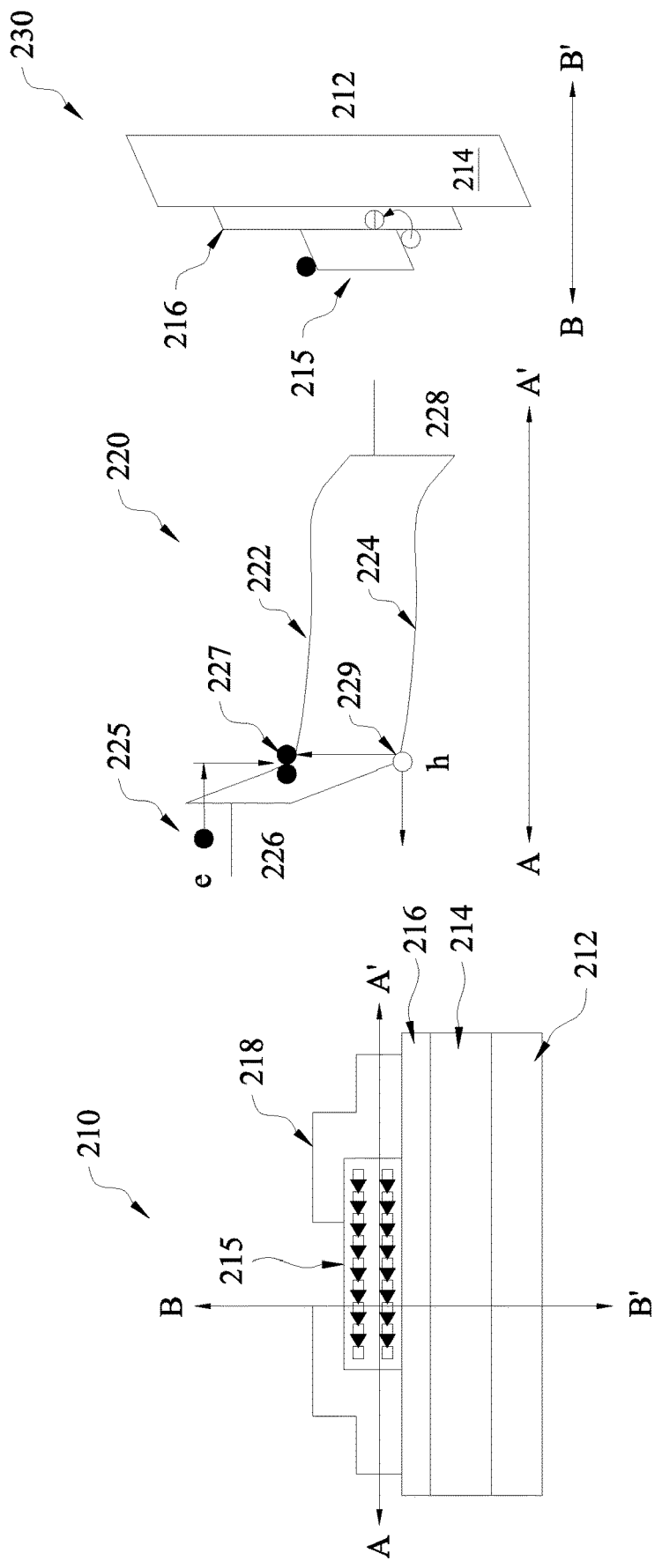

IMPACT IONIZATION SEMICONDUCTOR DEVICE AND MANUFACTURING METHOD THEREOF

CROSS-REFERENCE TO RELATED APPLICATIONS

This application is a Continuation of U.S. patent application Ser. No. 15/649,331 filed on Jul. 13, 2017, which claims priority to U.S. Provisional Application 62/427,706 filed Nov. 29, 2016, the entire disclosure of the two applications are incorporated herein by reference.

BACKGROUND

Semiconductor devices, built with advanced technology nodes (e.g., below 7 nm), regardless of the structure such as ultra-thin body silicon-on-insulator (SOI) or fin field-effect transistor (FinFET) structures, may have quite thin channel thickness (e.g., within a range of about 0.5-5 nm). For these devices, two-dimensional (2D) layered materials are regarded as strong candidates to replace silicon (Si). The 2D material of interest have desired properties, for example, including self-assembled molecular monolayers (e.g., with a thickness of <1 nm), high and symmetric electron and hole mobility (e.g., >200 cm$^2$/Vsec), and ideal surface properties without dangling bonds. The performance of 2D FETs, however, may be considerably limited by the contact resistance induced by non-ideal metal and/or 2D material contacts (e.g., with Schottky barrier). For 2D FETs, the method of reducing the contact resistance (e.g., source and drain (SD) contact resistance) may be an important role in providing a sufficient drain current (e.g., >1 µA/µm of channel width).

2D semiconductors are expected to be the channel material in the ultra-thin body transistors and are usually few-layer thick and exist as stacks of strongly bonded layers with weak interlayer van der Waals attraction. The weak interlayer attraction allows the layers to be mechanically or chemically exfoliated into individual, atomically thin layers. Examples of 2D materials include graphene, graphyne, borophene, silicene, germinate, transition metal dichalcogenide (TMDC) (e.g., molybdenum disulfide ($MoS_2$) or tungsten selenide ($WSe_2$)), black phosphorus, and the like.

Solutions are required that can simultaneously achieve a desired sub-threshold slope and on-current in 2D material (e.g., TMDC) channel FETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

The subject technology is directed to reducing source-drain contact resistance in semiconductor devices, such as filed-effect transistor (FET) devices, using two-dimensional (2D) layered material to form the device channel region. For example, in a FET device with transition metal dichalcogenide (TMD) channel that forms a Schottky metal-TMD contact, impact ionization at the source side causes generation of minority carriers. The subject technology introduces a charge-trapping layer that facilitates trapping minority carriers at the gate dielectric near the source region. The positive feedback between impact ionization and charge trapping induces desirable features such as rapid current increase (e.g., a subthreshold slope improvement to 50 mV/decade) and low contact resistance.

FIG. 2 depicts a 2D material formation stage of the method of FIG. 1 device according to one or more embodiments of the present disclosure.

FIG. 3 depicts source and drain formation stage of the method of FIG. 1 according to one or more embodiments of the present disclosure.

FIG. 4 depicts a charge-trapping layer formation stage of the method of FIG. 1 according to one or more embodiments of the present disclosure.

FIG. 5 depicts patterning and removing a portion of the charge-trapping layer formed in FIG. 4 according to one or more embodiments of the present disclosure.

FIG. 6 depicts a gate dielectric layer formation stage of the method of FIG. 1 according to one or more embodiments of the present disclosure.

FIG. 7 depicts a gate electrode formation stage of the method of FIG. 1 according to one or more embodiments of the present disclosure.

FIG. 9 depicts a gate electrode formation stage of the method of FIG. 8 according to one or more embodiments of the present disclosure.

FIG. 10 depicts a gate dielectric layer formation stage of the method of FIG. 8 according to one or more embodiments of the present disclosure.

FIG. 11 depicts a photo-resist layer formation and patterning stage of the method of FIG. 8 according to one or more embodiments of the present disclosure.

FIG. 12 depicts a charge-trapping layer formation stage of the method of FIG. 8 according to one or more embodiments of the present disclosure.

FIG. 13 depicts a 2D material layer formation stage of the method of FIG. 8 according to one or more embodiments of the present disclosure.

FIG. 14 depicts a source and drain formation stage of the method of FIG. 8 according to one or more embodiments of the present disclosure.

FIG. 15 depicts an example structure of a bottom-gate semiconductor device according to one or more embodiments of the present disclosure.

FIG. 16 depicts an example structure of a bottom-gate semiconductor device according to one or more embodiments of the present disclosure.

FIG. 17 depicts an example structure of a bottom-gate semiconductor device according to one or more embodiments of the present disclosure.

FIG. 18 depicts an example structure of a top-gate semiconductor device according to one or more embodiments of the present disclosure.

FIG. 19 depicts an example structure of a top-gate semiconductor device according to one or more embodiments of the present disclosure.

FIG. 20 depicts an example structure of a top-gate semiconductor device according to one or more embodiments of the present disclosure.

FIG. 21 depicts an example structure of a 2D MOSFET device according to one or more embodiments of the present disclosure.

FIG. 22 is a conceptual energy band diagram depicting an impact ionization mechanism in a 2D MOSFET device according to one or more embodiments of the present disclosure.

FIG. 23 is a conceptual energy band diagram depicting a hole trapping process in a 2D MOSFET device according to one or more embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed, interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The device may be otherwise oriented (rotated 90 degrees or at other orientations), and the spatially relative descriptors used herein may likewise be interpreted accordingly. In addition, the term "made of" may mean either "comprising" or "consisting of."

Figure 1:
FIG. 1 is a process flow chart depicting a method of manufacturing a semiconductor device according to one or more embodiments of the present disclosure.

FIG. 1 is a process flow chart 10 for manufacturing a semiconductor device having a top gate, according to one or more embodiments of the present disclosure. The flow chart 10 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

In S11 of FIG. 1, a two-dimensional (2D) material layer 24 is formed over a substrate 22 to form a channel structure, as shown in an X-cut view 20 of FIG. 2. The substrate 22 can be, for example, a p-type silicon substrate with an impurity concentration in a range of about $1 \times 10^{15}$ cm$^{-3}$ to about $3 \times 10^{15}$ cm$^{-3}$ in some embodiments. In other embodiments, the substrate is an n-type silicon substrate with an impurity concentration in a range of about $1 \times 10^{15}$ cm$^{-3}$ to about $3 \times 10^{15}$ cm$^{-3}$. The crystal orientation of Si substrate is (100) in some embodiments.

Alternatively, the substrate may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous Si or amorphous SiC, or insulating material, such as silicon oxide, may also be used as the substrate. The substrate may include various regions that have been suitably doped with impurities (e.g., p-type or n-type conductivity).

In some embodiments, the 2D material layer 24, shown in the X-cut view 20, is formed from a 2D material and is subsequently formed into a channel, an extension and S/D areas of an FET. The 2-D materials are usually few-layer thick and exist as stacks of strongly bonded layers with weak interlayer van der Waals attraction, allowing the layers to be mechanically or chemically exfoliated into individual, atomically thin layers. In some aspects, the disclosed 2D channel can be a 2D semiconductor including a transition metal dichalcogenide (TMDC), such as molybdenum disulfide (MoS$_2$), black phosphorous, or graphene. The 2D semiconductor may include one or more layers and can have a thickness within the range of about 0.5-100 nm in some embodiments. One advantageous feature of the few-layered 2D semiconductor is the high electron mobility ($\mu_e$) value, which is within a range of about 50-1000 cm$^2$/V–sec or even higher. It is understood that the bulk silicon, when cut to a low thickness (e.g., about 2 nm) comparable with a typical thickness of a 2D material film, can have its mobility degraded drastically.

It is understood that in many integrated circuits (ICs), the gate lengths of the widely used MOSFET devices are reduced or scaled down to increase the packing density of transistors in the IC and to increase the speed performance thereof. However, transistors with aggressively reduced gate lengths suffer from undesirable short-channel effects, such as increased off-state leakage current. One way to address suppressing of short-channel effects is to employ a semiconducting channel with a reduced thickness, referred to as an ultra-thin body transistor. For example, to effectively suppress short-channel effects in transistors having gate lengths smaller than about 20 nm, one way is to employ a semiconducting channel with reduced thickness, e.g., less than 5 nm. A transistor having a semiconductor channel with a thickness less than one-third or sometimes one-quarter of its gate length is commonly referred to as an ultra-thin body transistor. Ultra-thin body transistors may employ ultra-thin channel materials.

2D materials, also referred to as single-layer or few-layer materials, are crystalline materials of a few layers of atoms that are promising candidates for use for thin channel materials. One type of 2D material with high mobility is black phosphorus (BP). BP is a layered material and a monolayer of BP is termed phosphorene. BP is a semiconductor with a direct band gap ranging from about 1.5 eV for a monolayer to about 0.59 eV for a five-layer stack at the F point of the first Brillouin zone.

In some embodiments, the 2D material layer can be formed with a 2D material such as black phosphorus, using atomic layer deposition (ALD). The description of the deposition method is an example only and is not intended to be limiting beyond what is specifically discussed. As one example, orthorhombic black phosphorus can be grown by a short-way transport reaction from red phosphorus and tin and/or tin-iodide as a mineralization additive. In another example, black phosphorus can be synthesized from white phosphorus under high pressure (e.g., about 13,000 kg/cm$^2$) at a temperature within a range of about 200-250 degrees Celsius. The thickness of the 2D material can be controlled by the deposition time. In an embodiment, the period of multiple layers (e.g., thickness of a monolayer) of phosphorene is about 0.53 nm. In some embodiments, the thickness may range from one (1) monolayer to 20 monolayers (e.g., about 10.6 nm in thickness).

In S12 of FIG. 1, source and drain contacts 32 and 34 are formed over the channel structure 24, as shown in an X-cut view 30 of FIG. 3. In some embodiments, the source and drain contact materials include at least one element from a list of elements including molybdenum (Mo), tungsten (W), titanium (Ti), aluminum (Al), tantalum (Ta), strontium (Sr), palladium (Pd), gold (Au), silver (Ag), copper (Cu), hafnium (Hf), zirconium (Zr), and niobium (Nb). In some embodiments, the source and drain contacts form Schottky contacts having Schottky barriers. In some embodiments, example metals that can be used for the source and drain contacts include alloys such as TiN, TiAl, TiAlN, TaN, NiSi, CoSi, and other conductive materials with suitable work functions, or combinations thereof. In some implementations, the source and drain material can be deposited using chemical vapor deposition (CVD), physical vapor deposition (PVD), ALD, or other suitable deposition techniques and then patterned to form source and drain contacts 32 and 34. In some embodiments, an optional annealing process, for example, at a temperature within the range of about 250-350 degrees C. can be performed to improve the metal-to-source/drain contact resistance.

The Schottky barrier formed at the source and drain contacts 32 and 34 offers several features that are different from a diffused p-n junction. For example, in a Schottky barrier, pure electron injection and pure hole injection can be separately achieved. Further, the abrupt potential variation in the Schottky barrier provides a sufficiently high electric field for enhancing generation of impact ionization charge carriers (e.g., electrons or holes).

In S13 of FIG. 1, a charge-trapping layer 42 with a first thickness is formed over the channel structure, as shown in an X-cut view 40 of FIG. 4. In some embodiments, the charge-trapping dielectric layer 42 extends over portions of the source and drain contacts 32 and 34. In some embodiments, the charge-trapping dielectric layer 42 includes an oxide or nitride dielectric. In embodiments, the oxide or the nitride dielectric includes one or more elements from a list of elements including tantalum (Ta), titanium (Ti), hafnium (Hf), zirconium (Zr), aluminum (Al), lanthanum (La), yttrium (Y), niobium (Nb), silicon (Si), germanium (Ge), and gallium (Ga). In one or more embodiments, the thickness of the charge-trapping layer is within a range of about 1-10 nm. The charge-trapping layer can trap one type of charge carriers (e.g., holes) generated as a result of the impact ionization induced in the junctions (e.g., Schottky junctions) of the source and drain contacts 32 and 34.

In some embodiments, the dielectric charge-trapping layer 42 is deposited using PVD or CVD deposition techniques. In one or more embodiments, the PVD dielectric layer is deposited by reactive sputtering in $O_2$ or $N_2$ plasma at temperatures ranging from room temperature to about 400° C. In some embodiments, the CVD dielectric layer is deposited by plasma enhanced atomic layer deposition in $O_2$ or $N_2$ plasma at temperatures ranging from about 100° C. to about 400° C. In some embodiments, as shown in an X-cut view 50 of FIG. 5, portions of the charge-trapping layer 42 are removed to leave a portion 52 attached to the source contact 32. In some embodiments, the extension (e.g., W1) of the portion 52 attached to the source contact 32 into channel region is more than about 0.5 nm and less that about 20 nm. In some embodiments, similar to the portion 52, a portion 54 attached to the drain contact is also left after the removal of the portions of the charge-trapping layer 42.

In some embodiments, the 2D material layer forms a horizontal channel (e.g., in the X-Y plane, such as 24) or a vertical channel in the Z direction (e.g., in a FinFET device). Accordingly, the charge-trapping layer 42 may be deposited over the horizontal channel or the vertical channel, depending on the FET device structure.

In some embodiments, prior to forming the charge-trapping layer 42, an optional interfacial layer (not shown for simplicity) is formed over the channel structure 24. In some embodiments, the interfacial layer includes a 2D insulator material including alumina ($Al_2O_3$) or hexagonal boron nitride, or any suitable dielectric material.

The removal of portions of the charge-trapping layer 42 (and the optional interfacial layer) may be carried out by patterning. In some embodiments, the patterning can be performed by a known anisotropic etching or by a known mask patterning method.

In S14 of FIG. 1, a gate dielectric layer 62 is formed over the charge-trapping layers 52 and 54 and an exposed portion of the 2D material layer 24, as shown in an X-cut view 60 of FIG. 6. In some embodiments, the gate dielectric layer 62 includes a high-k dielectric material and one or more passivation structures (e.g., interfacial layers). The high-k dielectric material can comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer 62 is in the range of about 0.5 nm to about 10 nm.

In S15 of FIG. 1, a gate electrode layer 72 is formed over the gate dielectric layer 62 and suitably patterned, as shown in an X-cut view 70 of FIG. 7. In some embodiments, the gate electrode layer 72 is a poly-silicon layer. The patterning of the poly-silicon layer is performed by using a hard mask including a silicon nitride layer and an oxide layer in some embodiments. In other embodiments, the gate electrode layer includes a single layer or a multilayer structure. Further, the gate electrode layer may be doped poly-silicon with uniform or non-uniform doping. In some alternative embodiments, the gate electrode layer includes a metal such as Al, Cu, W, Ti, Ta, TiN, TiAl, TiAlN, TaN, NiSi, CoSi, and other conductive materials with a work function compatible with the substrate material, or combinations thereof. The gate electrode layer 72 may be formed using a suitable process such as ALD, CVD, PVD, plating, or combinations thereof. The width of the gate electrode layer (in the Y direction) is in the range of about 30 nm to about 60 nm in some embodiments.

In some embodiment, before formation of the gate electrode layer 72, one or more passivation structures and/or one or more spacer layers are formed on the gate dielectric layer 62. The passivation structures may serve as the gate dielectrics in some embodiment, under which the high-k dielectric is formed.

Figure 8:
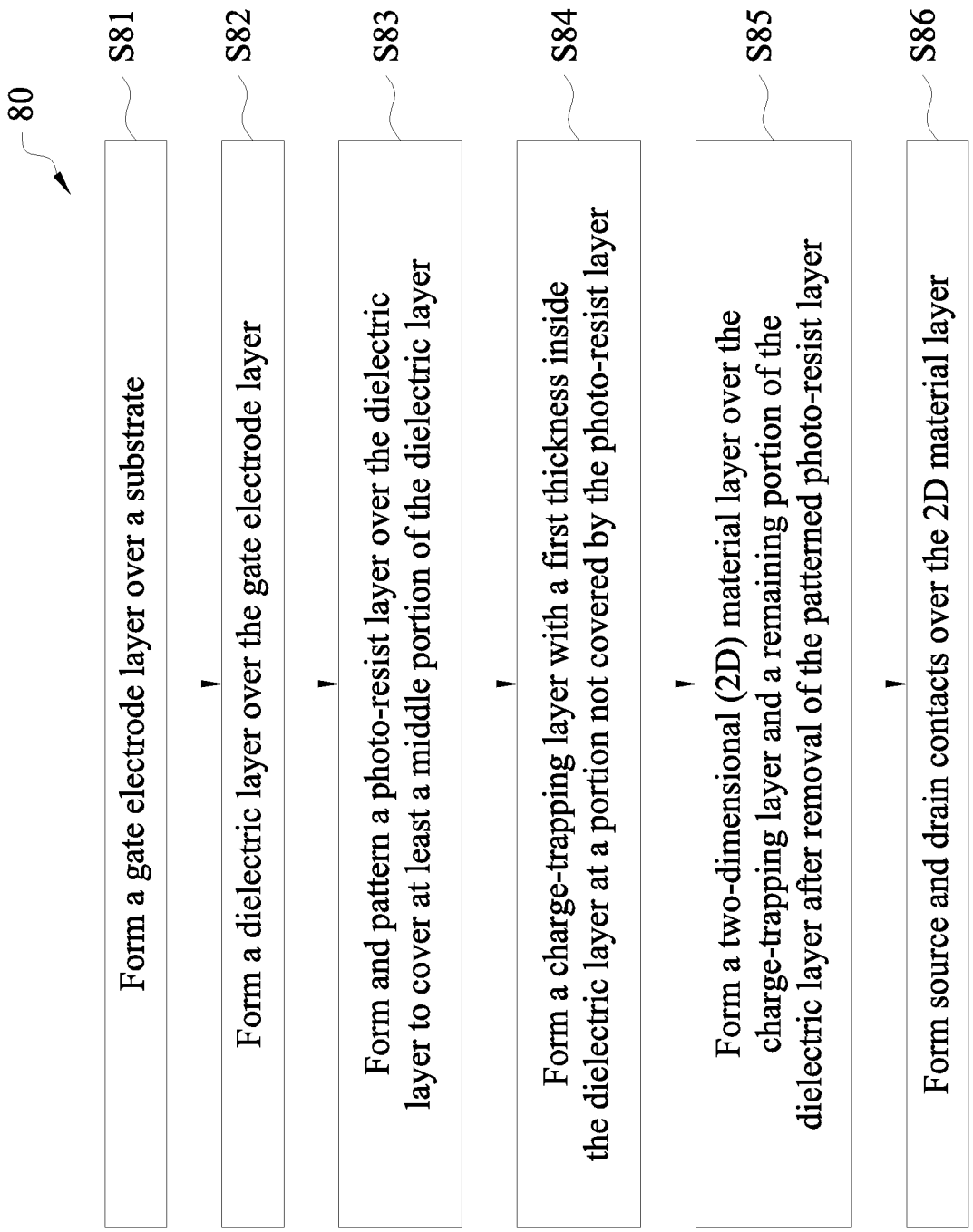
FIG. 8 is a process flow chart depicting a method of manufacturing a semiconductor device according to one or more embodiments of the present disclosure.

FIG. 8 is a process flow chart 80 for manufacturing a semiconductor device having a bottom (back) gate structure, according to one or more embodiments of the present disclosure. The flow chart 80 illustrates only a relevant part of the entire manufacturing process. It is understood that additional operations may be provided before, during, and after the operations shown by FIG. 8, and some of the operations described below can be replaced or eliminated for additional embodiments of the method. The order of the operations/processes may be interchangeable.

In S81 of FIG. 8, a gate electrode layer 94 is formed over a substrate 92, as shown in an X-cut view 90 of FIG. 9. The substrate 92 can be, for example, a p-type silicon substrate with an impurity concentration in a range of about $1\times10^{15}$ cm$^{-3}$ to about $3\times10^{15}$ cm$^{-3}$ in some embodiments. In other embodiments, the substrate is an n-type silicon substrate with an impurity concentration in a range of about $1\times10^{15}$ cm$^{-3}$ to about $3\times10^{15}$ cm$^{-3}$. The crystal orientation of Si substrate is (100) in some embodiments.

Alternatively, the substrate may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous Si or amorphous SiC, or insulating material, such as silicon oxide, may also be used as the substrate. The substrate may include various regions that have been suitably doped with impurities (e.g., p-type or n-type conductivity).

In some embodiments, the gate electrode layer 94 is a poly-silicon layer. The patterning of the poly-silicon layer is performed by using a hard mask including a silicon nitride layer and an oxide layer in some embodiments. In other embodiments, the gate electrode layer includes a single layer or a multilayer structure. Further, the gate electrode layer may be doped poly-silicon with uniform or non-uniform doping. In some alternative embodiments, the gate electrode layer includes a metal such as Al, Cu, W, Ti, Ta, TiN, TiAl, TiAlN, TaN, NiSi, CoSi, and other conductive materials with a work function compatible with the substrate material, or combinations thereof. The gate electrode layer 94 may be formed using a suitable process such as ALD, CVD, PVD, plating, or combinations thereof. The width of the gate electrode layer (in the Y direction) is in the range of about 30 nm to about 60 nm in some embodiments.

In S82 of FIG. 8, a dielectric layer 102 is formed over the gate electrode layer 94, as shown in an X-cut view 100 of FIG. 10. In some embodiments, the dielectric layer 102 includes a high-k dielectric material and one or more passivation structures (e.g., interfacial layers). The high-k dielectric material can comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer 102 is in the range of about 0.5 nm to about 10 nm.

In S83 of FIG. 8, a photo-resist (PR) layer is formed and patterned over the dielectric layer to cover at least a middle portion of the dielectric layer electrode layer 102, as shown in an X-cut view 110 of FIG. 11. The middle portion 115 of the PR layer is to mask the middle portion of the dielectric layer 102 from the next operation.

In S84 of FIG. 8, a charge-trapping layer with a first thickness is formed inside a portion of the dielectric layer not covered by the photo-resist layer, as shown in an X-cut view 120 of FIG. 12. The charge-trapping layers 122 and 124 are formed inside the portion of the dielectric layer 102 not covered by the photo-resist, by using a plasma treatment method. In other words, part of the dielectric layer is converted to the charge-trapping layers. In some embodiments, only the charge-trapping layer 122 may be formed. In some embodiments, the plasma treatment method includes using nitrogen ($N_2$) or ammonia ($NH_3$) plasma. The PR 115 is removed after the formation of the charge-trapping layer (s) (e.g., 122 and 124). The formation of the charge trapping layers 122 and 124 in portions of the dielectric layer 102 makes the thickness of dielectric layer 102 inhomogeneous, as shown in FIG. 13.

In S85 of FIG. 8, a 2D material layer 135 is formed over the charge-trapping layer (s) (e.g., 122 and 124) and a remaining portion of the dielectric layer 102 after removal of the patterned photo-resist layer 115, as shown in an X-cut view 130 of FIG. 13. In some aspects, the 2D material layer 135 can be a 2D semiconductor including a transition metal dichalcogenide (TMD), such as molybdenum disulfide ($MoS_2$), black phosphorous, or graphene. The 2D semiconductor may include one or more layers and can have a thickness within the range of about 0.5-100 nm in some embodiments.

In S86 of FIG. 8, source and drain contacts 132 and 134 are formed over the 2D material layer 135, as shown in an X-cut view 140 of FIG. 14. In some embodiments, the source and drain contact materials include at least one element from a list of elements including Mo, W, Ti, Al, Ta, Sr, Pd, gold (Au), silver (Ag), copper (Cu), Hf, Zr, and Nb. In some embodiments, the source and drain contacts 132 and 134 form Schottky contacts having Schottky barriers. In some embodiments, example metals that can be used for the source and drain contacts include alloys such as TiN, TiAl, TiAlN, TaN, NiSi, CoSi, and other conductive materials with suitable work functions, or combinations thereof. In some implementations, the source and drain contacts 132 and 134 can be deposited using chemical vapor deposition (CVD), physical vapor deposition (PVD), ALD, or other suitable deposition techniques and then patterned to form source and drain contacts 132 and 134. In some embodiments, an optional annealing process, for example, at a temperature within the range of about 250-350 degrees C. can be performed to improve the metal-to-source/drain contact resistance.

The Schottky barrier formed at the source and drain contacts 132 and 134 offers several features that are different from a diffused p-n junction. For example, in a Schottky barrier, pure electron injection and pure hole injection can be separately achieved. Further, the abrupt potential variation in the Schottky barrier provides a sufficiently high electric field for enhancing generation of impact ionization charge carriers (e.g., electrons or holes).

FIG. 15 depicts a structure 150 of a bottom-gate semiconductor device according to one or more embodiments of the present disclosure. The structure 150 shows a bottom gate configuration of a FET device, in which the charge-trapping layer 157, the gate dielectric layer 156 and the gate electrode 155 are not on the same side of the 2D material layer 153 as the source and drain contacts 152 and 154 are. The method of formation of the structure 150 and the material used are as discussed above with respect to FIGS. 8-14. In some embodiments, the formation of charge-trapping layer 157 is not compatible with requirements of the dielectric material of the gate dielectric layer 156 (e.g., when there is a potential of plasma damage on the gate dielectric layer). In such situations, the charge-trapping layer can be inhomogeneous and be selectively formed only near the source region, by using additional photolithography processes, as shown and described with regard to FIG. 16.

FIG. 16 depicts a structure 160 of a bottom-gate semiconductor device according to one or more embodiments of the present disclosure. In the structure 160, the charge-trapping layer 162 is formed in an area near the source contact 152, around which the impact ionization is taking place and the charge-trapping layer has the most benefit in reducing the contact resistance. The structure 160 shows a bottom gate configuration of an FET device, in which the charge-trapping layer 162, the gate dielectric layer 156 and the gate electrode 155 are not on the same side of the 2D material layer 153 as the source and drain contacts 152 and 154 are. The method of formation of the structure 160 and the material used are as discussed above with respect to FIGS. 8-14. In some embodiments, because the symmetry of source and drain is desirable for circuit design reasons, the charge-trapping layer can be formed in both source and drain regions as shown in FIG. 17 described below.

FIG. 17 depicts a structure 170 of a bottom-gate semiconductor device according to one or more embodiments of the present disclosure. In the structure 170, the charge-trapping layer 162 is formed in an area near the source contact 152 and the charge-trapping layer 172 is formed in an area near the drain contact 154. The structure 170 shows a bottom gate configuration of a FET device, in which the charge-trapping layers 162 and 172, the gate dielectric layer 156 and the gate electrode 155 are not on the same side of the 2D material layer 153 as the source and drain contacts 152 and 154 are. The method of formation of the structure 170 and the material used are as discussed above with respect to FIGS. 8-14.

FIG. 18 depicts a structure 180 of a top-gate semiconductor device according to one or more embodiments of the present disclosure. In the structure 180, the charge-trapping layer 182 is formed over a 2D material 185 and portions of the source and drain contacts 152 and 154. The gate dielectric layer 184 is formed over the charge-trapping layer 182 and the gate electrode 186 is formed in a gate region of the FET device over the gate dielectric layer 184. The structure 180 shows a top gate configuration of the FET device, in which the source and drain contacts 152 and 154, the charge-trapping layer 182, the gate dielectric layer 184, and the gate electrode 186 are on the same side of the 2D material layer 185. The method of formation of the structure 180 and the material used are as discussed above with respect to FIGS. 1-7. In some embodiments, the formation of charge-trapping layer 182 may undesirably increase the effective oxide thickness of the gate dielectric 184. In such situations, the charge-trapping layer can be inhomogeneous and selectively formed only near the source region by using additional photolithography processes, as shown and described with regard to FIG. 19.

FIG. 19 depicts a structure 190 of a top-gate semiconductor device according to one or more embodiments of the present disclosure. In the structure 190, the charge-trapping layer 192 is formed over the 2D material 185 and near the source contact 152. The charge-trapping layer 192 is in contact with the source contact 152. The gate dielectric layer 184 is formed over the charge-trapping layer 192, the 2D material layer 185, and portions of the source and drain contacts 152 and 154. The gate electrode 186 is formed in a gate region of the FET device over the gate dielectric layer 184. The structure 190 shows a top gate configuration of the FET device, in which the source and drain contacts 152 and 154, the charge-trapping layer 192, the gate dielectric layer 184, and the gate electrode 186 are on the same side of the 2D material layer 185. The method of formation of the structure 190 and the material used are similar to the method and materials as discussed above with respect to FIGS. 1-7. In some embodiments, because the symmetry of source and drain is desirable for circuit design reasons, the charge-trapping layer can be formed in both source and drain regions as shown in FIG. 20, described below.

FIG. 20 depicts a structure 200 of a top-gate semiconductor device according to one or more embodiments of the present disclosure. In the structure 200, the charge-trapping layers 202 and 204 are formed over the 2D material 185 and near the source contact 152 and the drain contact 154. The charge-trapping layer 202 and 204 are, respectively, in contact with the source contact 152 and the drain contact 154. The gate dielectric layer 184 is formed over the charge-trapping layers 202 and 204, the 2D material layer 185, and portions of the source and drain contacts 152 and 154. The gate electrode 186 is formed in a gate region of the FET device over the gate dielectric layer 184. The structure 200 shows a top gate configuration of the FET device, in which the source and drain contacts 152 and 154, the charge-trapping layers 202 and 204, the gate dielectric layer 184, and the gate electrode 186 are on the same side of the 2D material layer 185. The method of formation of the structure 200 and the material used are similar to the method and materials as discussed above with respect to FIGS. 1-7.

FIG. 21 depicts an example structure 210 of a 2D MOSFET device according to one or more embodiments of the present disclosure. The structure 210 is a bottom gate structure, in which the source and drain electrodes 218 are Mo, the 2D material channel 215 is $MoS_2$, the charge-trapping layer 216 is tantalum oxide or hafnium oxide with a thickness about 10 nm, the gate dielectric layer 214 is an approximately 100 nm thick layer of $SiO_2$, and the gate electrode 212 is formed of silicon (Si). The charge-trapping mechanism of the structure 210 is discussed below with respect to FIGS. 22 and 23.

FIG. 22 is a conceptual energy band diagram 220 depicting an impact ionization mechanism in a 2D MOSFET device according to one or more embodiments of the present disclosure. The diagram 220 shows a band structure of the $MoS_2$ material of the channel 215 of FIG. 21 across a cross section AA' of FIG. 21. The band structure includes a conduction band edge 222 and a valence band edge 224 showing a potential barrier with a steep slope near the source region 226. The electrons 225 from the source region 226 of the device are injected in the direction of the top horizontal arrow towards the channel conduction band. These electrons can be accelerated by moving down the potential barrier (thus gaining kinetic energy) and generate impact ionization electrons 227 and holes 229. The vertical arrow from high-energy to low-energy conduction band represents an electron scattering process on an electron of the valence band 224, which results in loss of kinetic energy of the scattered electrons. On the other hand, the electron at the valance band 224, on which the electron from the conduction band 222 scattered can gain energy from the scattering and be excited to the conduction band 222. As a result, a hole 229 is left behind at the valance band 224, as part of the impact ionization. Most impact-ionized holes drift toward the source region 226, while most electrons drift toward the drain region 228. The electron drift is not included in the diagram 220 for simplicity. Only some of impact-ionized holes are trapped in charge-trapping layer 216 (e.g., $TaO_x$) in the vertical direction. The positive feedback process induces a rapid drain current increase and low source and drain contact resistances The positive feedback is initiated by the trapped holes modulating the local potential and resulting in a potential barrier with an even steeper slope near the source region 226. This further increases the electron injection from the source region 226 and induces more impact ionization electrons 227 and holes 229 in a positive feedback fashion.

FIG. 23 is a conceptual diagram 230 depicting a hole trapping process in a 2D MOSFET device according to one or more embodiments of the present disclosure. The diagram 230 corresponds to a cross section across BB' of FIG. 21 and shows the generation of charge carriers (e.g., electrons and holes) in the channel 215 of FIG. 21 near the source region (e.g., 226 of FIG. 22) and the subsequent capture of the generated holes by the electrons of the charge-trapping layer (e.g., TaO of charge-trapping layer 216 of FIG. 21) near the source region (e.g., 226 of FIG. 22). The generation and subsequent capture of the holes initiate a positive feedback process that induces a rapid drain current increase and low source and drain contact resistances. (e.g., 218 of FIG. 21). Further, the 2D TMDC FET device of the subject technology achieves a steep subthreshold slope and a high on-current simultaneously.

It will be understood that not all advantages have been necessarily discussed herein, no particular advantage is required for all embodiments or examples, and other embodiments or examples may offer different advantages.

In accordance with one aspect of the present disclosure, a semiconductor device including a field effect transistor (FET) device includes a substrate and a channel structure including a two-dimensional (2D) material. The semiconductor device further includes a first dielectric layer and a second dielectric layer formed between the channel structure and the first dielectric layer and configured to trap charge carriers generated near a source side of the channel structure. The semiconductor device further includes source and drain contacts that are configured to be at least partially in contact with the second dielectric layer, and a gate electrode in contact with the first dielectric layer.

In accordance with another aspect of the present disclosure, a method for manufacturing a semiconductor device includes forming a two-dimensional (2D) material layer over a substrate to form a channel structure. Source and drain contacts are formed over the channel structure. A charge-trapping layer with a first thickness is formed over the channel structure to trap charge carriers. The charge-trapping layer is in contact with a portion of the source and drain contacts. A gate dielectric layer is formed over the charge-trapping layer, and a gate electrode layer is formed over the gate dielectric layer.

In accordance with yet another aspect of the present disclosure, a method for manufacturing a semiconductor device includes forming a gate electrode layer over a substrate and depositing a dielectric layer over the gate electrode layer. A photo-resist layer is deposited and patterned over the dielectric layer to cover at least a middle portion of the dielectric layer. A charge-trapping layer with a first thickness is formed inside a portion of the dielectric layer not covered by the photo-resist layer. A two-dimensional (2D) material layer is deposited over the charge-trapping layer and a remaining portion of the dielectric layer after removing the patterned photo-resist layer. Source and drain contacts are formed over the 2D material layer.

The foregoing outline features several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a channel structure on a substrate;
    forming source and drain contacts over the channel structure;
    forming a charge-trapping layer over the channel structure to trap charge carriers, the charge-trapping layer comprising a first portion in contact with the source contact and a second portion separate from the first portion and in contact with the drain contact;
    forming a gate dielectric layer over the charge-trapping layer; and
    forming a gate electrode layer over the gate dielectric layer, wherein prior to forming the gate dielectric layer, removing the second portion of the charge-trapping layer to leave the first portion in contact with the source contact.

2. The method of claim 1, wherein prior to forming the gate electrode layer, forming one or more spacer layers on the gate dielectric layer, and wherein the gate dielectric layer includes a high-k dielectric material.

3. The method of claim 1, further comprising:
    prior to forming the charge-trapping layer, forming an interfacial layer over the channel structure, wherein the interfacial layer comprises a 2D insulator material including alumina ($Al_2O_3$) or hexagonal boron nitride.

4. The method of claim 1, wherein forming the charge-trapping layer comprises:
    depositing a dielectric layer over the channel structure;
    treating the dielectric layer to form the charge-trapping layer; and
    prior to forming the gate dielectric layer, removing a portion of the charge-trapping layer to leave the first and second portions of the charge-trapping layer that are in contact with the source contact and the drain contact.

5. The method of claim 1, wherein the channel structure comprises a material including a transition metal dichalcogenide (TMDC), wherein the TMDC includes an element from a list of elements including molybdenum (Mo), tungsten (W), titanium (Ti), tantalum (Ta), niobium (Nb), hafnium (Hf), zirconium (Zr), and palladium (Pd) or comprises molybdenum disulfide ($MoS_2$) or tungsten selenide ($WSe_2$).

6. The method of claim 1, wherein forming the charge-trapping layer comprises forming a charge-trapping dielectric layer including an oxide or nitride dielectric.

7. The method of claim 6, wherein the oxide or nitride dielectric includes at least one element from a group consisting of tantalum (Ta), titanium (Ti), hafnium (Hf), zirconium (Zr), aluminum (Al), lanthanum (La), yttrium (Y), niobium (Nb), silicon (Si), germanium (Ge), and gallium (Ga).

8. The method of claim 1, wherein a first thickness of the charge-trapping layer is within a range of 1-10 nm, and wherein trapped charge carriers include holes.

9. The method of claim 1, further comprising, prior to forming the gate electrode layer, forming one or more spacer layers on the gate dielectric layer.

10. A semiconductor device, comprising:
    a substrate;
    a channel structure disposed on the substrate;
    a first dielectric layer;

a second dielectric layer formed between the channel structure and the first dielectric layer, the second dielectric layer comprises a charge-trapping portion distinct form a rest of the second dielectric layer and configured to trap charge carriers generated near a source side of the channel structure, wherein the second dielectric layer is formed over an entire channel structure and over portions of first surfaces of source and drain contacts when the semiconductor device is a top gate device, wherein the first surfaces are in a plane of the substrate, wherein the channel structure extends in at least one of a first plane or a second plane perpendicular to the first plane, and wherein the first plane is the plane of the substrate;

a source contact configured to be at least partially in contact with the second dielectric layer; and a gate electrode in contact with the first dielectric layer.

11. The semiconductor device of claim 10, wherein the source and drain contacts comprise Schottky contacts.

12. The semiconductor device of claim 11, wherein the second dielectric layer is formed in regions of the channel structure near the source contact or near the source and drain contacts, wherein the second dielectric layer is in contact with second surfaces of the source and drain contacts, wherein the second surfaces are perpendicular to a plane of the substrate when the semiconductor device is a top gate device.

13. The semiconductor device of claim 10, wherein the semiconductor device is a top gate device, wherein the second dielectric layer is formed over a portion of the channel structure near the source contact and is in contact with a second surface of the source contact, wherein the second surface is perpendicular to a plane of the substrate, and wherein the charge-trapping portion of the second dielectric layer covers less than about 20 nm of a channel length of the channel structure.

14. The semiconductor device of claim 10, further comprising an interfacial layer formed over the channel structure, wherein the interfacial layer comprises a 2D insulator material including alumina ($Al_2O_3$) or hexagonal boron nitride.

15. The semiconductor device of claim 10, wherein the second dielectric layer is about 1-10 nm thick, and wherein the first dielectric layer comprises a gate dielectric layer, and wherein the second dielectric layer comprises an oxide or nitride dielectric including at least one element from a group consisting of tantalum (Ta), titanium (Ti), hafnium (Hf), zirconium (Zr), aluminum (Al), lanthanum (La), yttrium (Y), niobium (Nb), silicon (Si), germanium (Ge), and gallium (Ga).

16. A method for manufacturing a semiconductor device, comprising:

forming a channel structure on a substrate;

forming source and drain contacts over the channel structure;

forming a charge-trapping layer over the channel structure to trap charge carriers, the charge-trapping layer comprising a first portion in contact with the source contact and a second portion separated from the first portion and in contact with the drain contact, wherein the charge-trapping layer comprises a charge-trapping dielectric layer including an oxide or nitride dielectric;

forming a gate dielectric layer over the charge-trapping layer; and forming a gate electrode layer over the gate dielectric layer, wherein a thickness of the channel structure is less than about one-third of a length of the gate electrode layer, and wherein forming the charge-trapping layer comprises:

depositing a dielectric layer over the channel structure;

treating the dielectric layer to form the charge-trapping layer; and prior to forming the gate dielectric layer, removing a portion of the charge-trapping layer, to leave the first and second portions of the charge-trapping layer that are in contact with the source contact and the drain contact.

17. The method of claim 16, further comprising:

prior to forming the forming an interfacial layer over the channel structure, wherein the interfacial layer comprises a 2D insulator material including alumina ($Al_2O_3$) or hexagonal boron nitride.

18. The method of claim 16, wherein an extension of the first portion that is in contact with the source contact into the channel structure is less than 20 nm.

19. The method of claim 16, wherein the source and drain contacts comprise Schottky contacts.

20. The method of claim 16, wherein source and drain contact materials include at least one element from a group consisting of Mo, W, Ti, Al, Ta, Sr, Pd, gold (Au), silver (Ag), copper (Cu), Hf, Zr, and Nb.

* * * * *